United States Patent
Sun et al.

(10) Patent No.: US 12,355,455 B2
(45) Date of Patent: Jul. 8, 2025

(54) DIGITAL-TO-ANALOG CONVERTER WITH SORTING OF UNIT CELLS THAT IS BASED ON MISMATCH ERRORS AND/OR SELECTION OF NEW POINTER LOCATION THAT IS BASED ON UTILIZATION RATES OF UNIT CELLS AND ASSOCIATED METHOD

(71) Applicant: MEDIATEK INC., Hsin-Chu (TW)

(72) Inventors: Wei-Hao Sun, Hsinchu (TW);
Chuan-Hung Hsiao, Hsinchu (TW);
Sung-Han Wen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 199 days.

(21) Appl. No.: 18/206,623

(22) Filed: Jun. 7, 2023

(65) Prior Publication Data

US 2024/0039548 A1    Feb. 1, 2024

Related U.S. Application Data

(60) Provisional application No. 63/369,668, filed on Jul. 28, 2022.

(51) Int. Cl.
*H03M 1/06* (2006.01)

(52) U.S. Cl.
CPC ............................... *H03M 1/0604* (2013.01)

(58) Field of Classification Search
CPC ...... H03M 1/66; H03M 1/066; H03M 1/0604; H03M 1/0653; H03M 1/747
See application file for complete search history.

(56) References Cited

U.S. PATENT DOCUMENTS

| | | | |
|---|---|---|---|
| 8,643,525 B1* | 2/2014 | Wen | H03M 1/067 |
| | | | 375/252 |
| 9,077,369 B1* | 7/2015 | Tsang | H03M 3/338 |
| 9,337,854 B1* | 5/2016 | Chen | H03M 1/0673 |
| 9,543,974 B1* | 1/2017 | Yang | H03M 1/0863 |
| 9,577,657 B1* | 2/2017 | Clara | H03M 1/109 |
| 9,705,521 B1* | 7/2017 | Monk | H03M 1/66 |
| 9,859,914 B1* | 1/2018 | Weng | H03M 3/436 |
| 9,966,969 B1* | 5/2018 | Engel | H03M 1/662 |
| 10,090,854 B1* | 10/2018 | Clara | H03M 1/70 |
| 11,128,310 B1* | 9/2021 | Zhao | H03M 1/1071 |

(Continued)

FOREIGN PATENT DOCUMENTS

EP       2 941 826 A1    11/2015

OTHER PUBLICATIONS

Ian Galton, Why Dynamic-Element-Matching DACs Work, IEEE Transactions on Circuits and Systems-II: Express Briefs, vol. 57, No. 2, Feb. 2010, p. 69-74, IEEE, XP011303636, 2010/2.

(Continued)

*Primary Examiner* — Lam T Mai
(74) *Attorney, Agent, or Firm* — Winston Hsu

(57) ABSTRACT

A digital-to-analog converter (DAC) includes a plurality of DAC cells, a mismatch error sorting circuit, and a dynamic element matching (DEM) circuit. The mismatch error sorting circuit generates a sorting result of the plurality of DAC cells according to mismatch error levels of the plurality of DAC cells. The DEM circuit shapes the mismatch error levels of the plurality of DAC cells according to the sorting result of the plurality of DAC cells.

20 Claims, 15 Drawing Sheets

(56) References Cited

U.S. PATENT DOCUMENTS

| | | | | |
|---|---|---|---|---|
| 2007/0241950 | A1* | 10/2007 | Petilli | H03M 1/0663 341/143 |
| 2010/0149012 | A1* | 6/2010 | Nguyen | H03M 1/0663 341/143 |
| 2011/0227629 | A1* | 9/2011 | Chang | H03M 1/066 327/415 |
| 2013/0222168 | A1* | 8/2013 | Clara | H03M 1/1061 341/150 |
| 2014/0152480 | A1* | 6/2014 | Nguyen | H03M 1/66 341/144 |
| 2015/0048959 | A1* | 2/2015 | Zhu | H03M 1/74 341/118 |
| 2016/0308545 | A1* | 10/2016 | Chandra | H03M 1/066 |
| 2017/0019118 | A1* | 1/2017 | Zhu | H03M 1/0617 |
| 2017/0077937 | A1* | 3/2017 | Shu | H03M 1/066 |
| 2017/0170839 | A1* | 6/2017 | Zhao | H03M 1/1038 |
| 2018/0091164 | A1* | 3/2018 | Zhu | H03M 1/08 |
| 2018/0097524 | A1* | 4/2018 | Chandra | H03M 1/1038 |
| 2018/0226980 | A1* | 8/2018 | Chandra | H03M 1/1038 |
| 2019/0044524 | A1* | 2/2019 | Chandra | H03M 1/066 |
| 2019/0165820 | A1* | 5/2019 | Xu | H03M 3/502 |
| 2023/0412181 | A1* | 12/2023 | Hsiao | H03M 1/0604 |
| 2024/0039547 | A1* | 2/2024 | Nguyen | H03M 1/662 |
| 2024/0072821 | A1* | 2/2024 | Perrott | H03K 19/018564 |

OTHER PUBLICATIONS

Shaiful Nizam Mohyar et al., SFDR Improvement Algorithms for Current-Steering DACs, Key Engineering Materials, May 11, 2015, p. 101-108, vol. 643, Trans Tech Publications Ltd, Switzerland, XP093106280, May 11, 2015.

Georgi Ivanov Radulov, Flexible and self-calibrating current-steering Digital-to-Analog Converters: analysis, classification and design, Jan. 14, 2010, p. 1-290, XP055278724, Jan. 14, 2010.

Shuo Huang et al., A 14b 1GS/s DAC with SFDR>80 dBc Across the Whole Nyquist Band by Mixed Total 3-Dimensional Sort-and-Combine and Dynamic Element Matching, 2015, p. 1-4, IEEE, Shanghai, China, XP032925916, 2015.

Matamura, An 82mW AZ-Based Filter-Less Class-D Headphone Amplifier with -93dB THD+N, 113dB SNR and 93% Efficiency, ISSCC 2021 / Session 31 / Analog Techniques / 31.1, pp. 432-433 and a page including Figure 31.1.7 ,2021.

Bandyopadhyay, A 120dB-SNR 100dB-THD+N 21.5mW/Channel Multibit CT ΔΣ DAC, ISSCC 2011 / Session 27 / Oversampling Converters / 27.7, pp. 482-483 and a page including Figure 27.7.7, 2011.

* cited by examiner

DIGITAL-TO-ANALOG CONVERTER WITH SORTING OF UNIT CELLS THAT IS BASED ON MISMATCH ERRORS AND/OR SELECTION OF NEW POINTER LOCATION THAT IS BASED ON UTILIZATION RATES OF UNIT CELLS AND ASSOCIATED METHOD

CROSS REFERENCE TO RELATED APPLICATIONS

This application claims the benefit of U.S. Provisional Application No. 63/369,668, filed on Jul. 28, 2022. The content of the application is incorporated herein by reference.

BACKGROUND

The present invention relates to a digital-to-analog converter design, and more particularly, to a digital-to-analog converter with sorting of unit cells that is based on mismatch errors and/or selection of a new pointer location that is based on utilization rates of unit cells, and an associated method.

Multi-bit digital-to-analog converters (DACs) are more favorable in certain applications. However, their drawback is that they cannot guarantee linearity in the presence of DAC cell mismatch. The mismatch errors can cause significant DAC performance degradation. One of the common ways to handle the mismatch errors is to use a dynamic element matching (DEM) technique. For example, by randomly selecting the DAC cells, the DEM technique can turn signal-dependent errors into signal-independent noise. The conventional DEM techniques may re-use DAC cells in the opposite polarity as soon to cancel the mismatch errors. However, it is possible that the distribution formed by mismatch errors of the DAC cells may not be the optimal case for error cancellation. As a result, the conventional DEM techniques cannot achieve the best mismatch-shaping ability. Furthermore, the conventional DEM techniques may change a current pointer location to a new pointer location based on a random, shift, or fixed value when two pointers are pointing to the same location. However, such a pointer location selection scheme introduces additional noise or distortion, thus degrading the SNR (Signal-to-Noise Ratio)/SNDR (Signal-to-Noise and Distortion Ratio). Specifically, a new pointer location selected based on a fixed value has low noise floor but introduces large harmonic distortion, leading to worse SNDR/SFDR (Spurious-Free Dynamic Range). A new pointer location selected based on a random value spreads the harmonic distortion to noise, leading to increased noise floor and worse SNR. Thus, there is a need for innovative DEM designs which are capable of addressing above issues.

SUMMARY

One of the objectives of the claimed invention is to provide a digital-to-analog converter with sorting of unit cells that is based on mismatch errors and/or selection of a new pointer location that is based on utilization rates of unit cells, and an associated method.

According to a first aspect of the present invention, an exemplary digital-to-analog converter (DAC) is disclosed. The exemplary DAC includes a plurality of DAC cells, a mismatch error sorting circuit, and a dynamic element matching (DEM) circuit. The mismatch error sorting circuit is arranged to generate a sorting result of the plurality of DAC cells according to mismatch error levels of the plurality of DAC cells. The DEM circuit is arranged to shape the mismatch error levels of the plurality of DAC cells according to the sorting result of the plurality of DAC cells.

According to a second aspect of the present invention, an exemplary digital-to-analog converter (DAC) is disclosed. The exemplary DAC includes a plurality of DAC cells, a storage device, a pointer location selecting circuit, and a dynamic element matching (DEM) circuit. The storage device is arranged to record utilization rates of the plurality of DAC cells. The pointer location selecting circuit is arranged to select a new pointer location according to the utilization rates of the plurality of DAC cells and an input code. The DEM circuit is arranged to shape the mismatch error levels of the plurality of DAC cells according to the new pointer location selected by the pointer location selecting circuit and the input code received by the DEM circuit.

According to a third aspect of the present invention, an exemplary digital-to-analog conversion method is disclosed. The exemplary digital-to-analog conversion method includes: generating a sorting result of a plurality of DAC cells according to mismatch error levels of the plurality of DAC cells; and performing a dynamic element matching (DEM) operation to shape the mismatch error levels of the plurality of DAC cells according to the sorting result of the plurality of DAC cells.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
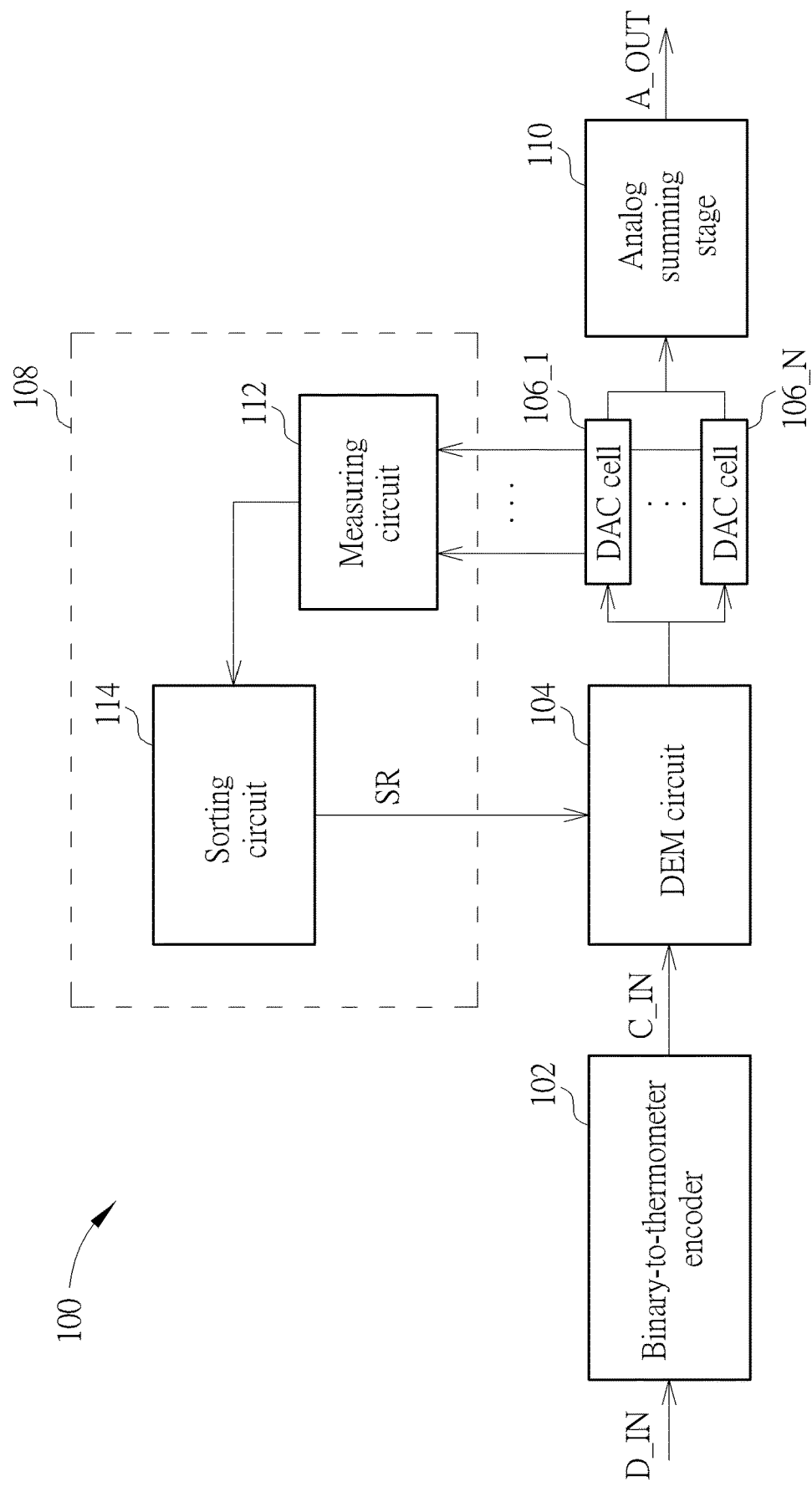
FIG. 1 is a diagram illustrating a first digital-to-analog converter (DAC) that employs a dynamic element matching (DEM) technique with proposed mismatch error sorting according to an embodiment of the present invention.

FIG. 1 is a diagram illustrating a first digital-to-analog converter (DAC) that employs a dynamic element matching (DEM) technique with proposed mismatch error sorting according to an embodiment of the present invention. The DAC 100 includes a binary-to-thermometer encoder 102, a DEM circuit 104, a plurality of DAC cells 106_1-106_N (N≥2), a mismatch error sorting circuit 108, and an analog summing stage 110, where the mismatch error sorting circuit 108 includes a measuring circuit 112 and a sorting circuit 114. The binary-to-thermometer encoder 102 is arranged to convert a data input (which is a signed binary data) D_IN into a signed thermometer code as an input code C_IN of the DEM circuit 104. In this embodiment, the mismatch error sorting circuit 108 is arranged to generate a sorting result SR of the DAC cells 106_1-106_N according to mismatch error levels of the DAC cells 106_1-106_N. Specifically, the sorting result SR of the DAC cells 106_1-106_N defines a sequence of sorted DAC cells whose mismatch error levels correspond to a particular pattern such as a triangular-wave-like pattern. The DEM circuit 104 is arranged to shape the mismatch error levels of the DAC cells 106_1-106_N according to the sorting result SR of the DAC cells 106_1-106_N. Specifically, each of the DAC cells 106_1-106_N is a unit cell that can be selected by the DEM circuit 104, and the DEM circuit 104 refers to the input code C_IN (which is a signed thermometer code) and the sorting result SR of the DAC cells 106_1-106_N (which is obtained from sorting the DAC cells 106_1-106_N according to their mismatch error levels) to select M (M≤N) DAC cells from the DAC cells 106_1-106_N, and the analog summing stage 110 combines DAC outputs of the M selected DAC cells to generate an analog output A_OUT of the data input D_IN.

Figure 2:
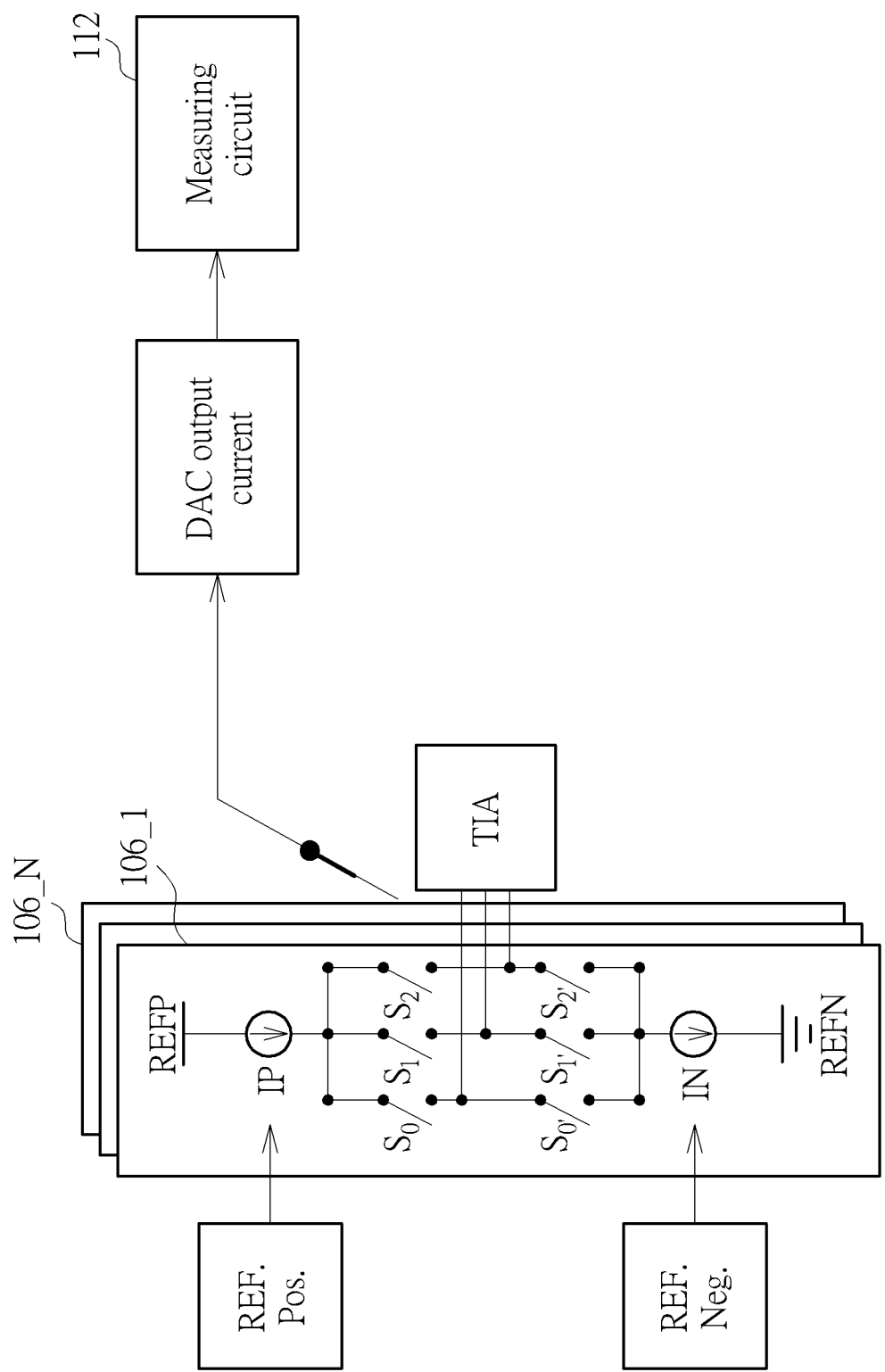
FIG. 2 is a diagram illustrating a measuring circuit which acquires mismatch error levels of DAC cells by measuring current outputs according to an embodiment of the present invention.

In one exemplary implementation, the measuring circuit 112 is arranged to acquire the mismatch error levels of the DAC cells 106_1-106_N by measuring current outputs of the DAC cells 106_1-106_N, as illustrated in FIG. 2. In this embodiment, the DAC cells 106_1-106_N are tri-level DAC cells, where each tri-level DAC cell has a switch circuit (which includes a plurality of switches $S_0$, $S_1$, $S_2$, $S_{0'}$, $S_{1'}$, $S_{2'}$, each being selectively coupled to a transimpedance amplifier (TIA) that may be a part of the analog summing stage 110), a current source IP that is biased by a reference voltage (labeled by "REF. Pos.") and coupled between a supply voltage REFP and the switch circuit, and a current sink IN that is biased by a reference voltage (labeled by "REF. Neg.") and coupled between a ground voltage REFN and the switch circuit. However, this is for illustrative purposes only, and is not meant to be a limitation of the present invention. Alternatively, the DAC cells 106_1-106_N may be implemented using bi-level DAC cells.

Figure 3:
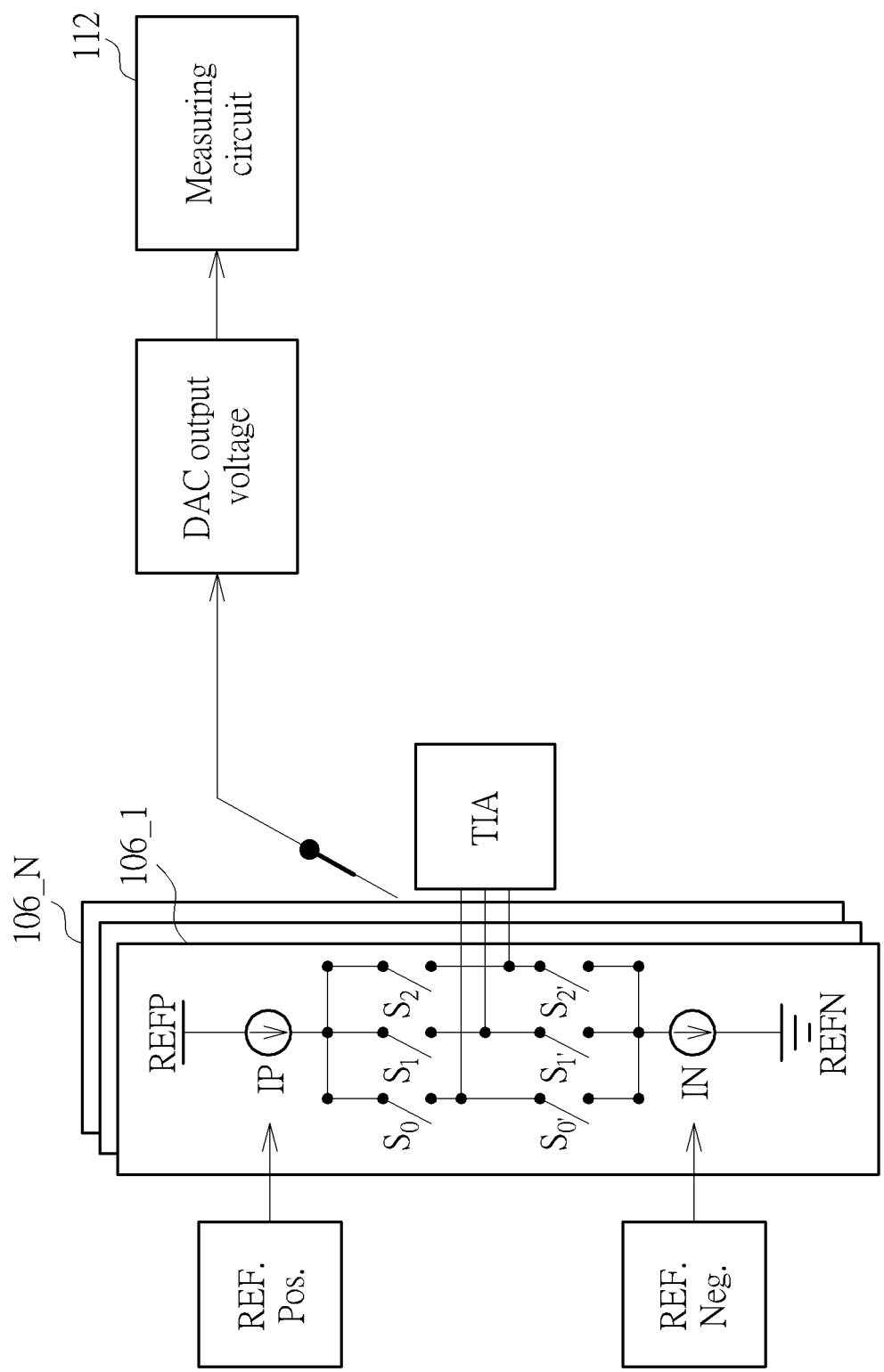
FIG. 3 is a diagram illustrating a measuring circuit which acquires mismatch error levels of DAC cells by measuring voltage outputs according to an embodiment of the present invention.

In another exemplary implementation, the measuring circuit 112 is arranged to acquire the mismatch error levels of the DAC cells 106_1-106_N by measuring voltage outputs of the DAC cells 106_1-106_N, as illustrated in FIG. 3. In this embodiment, the DAC cells 106_1-106_N are tri-level DAC cells, where each tri-level DAC cell has a switch circuit (which includes a plurality of switches $S_0$, $S_1$, $S_2$, $S_{0'}$, $S_{1'}$, $S_{2'}$, each being selectively coupled to a TIA that may be a part of the analog summing stage 110), a current source IP that is biased by a reference voltage (labeled by "REF. Pos.") and coupled between a supply voltage REFP and the switch circuit, and a current sink IN that is biased by a reference voltage (labeled by "REF. Neg.") and coupled between a ground voltage REFN and the switch circuit. However, this is for illustrative purposes only, and is not meant to be a limitation of the present invention. Alternatively, the DAC cells 106_1-106_N may be implemented using bi-level DAC cells.

Figure 4:
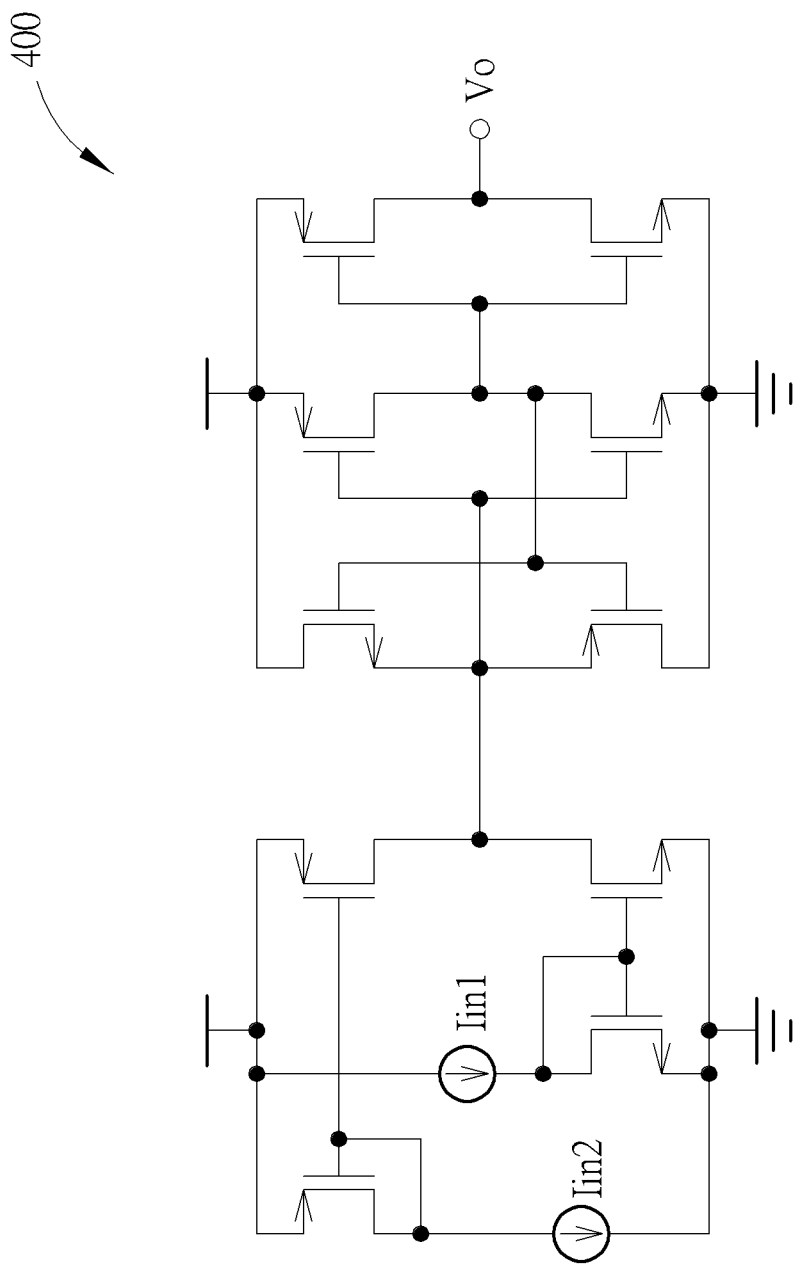
FIG. 4 is a diagram illustrating a first current comparator according to an embodiment of the present invention.
Figure 6:
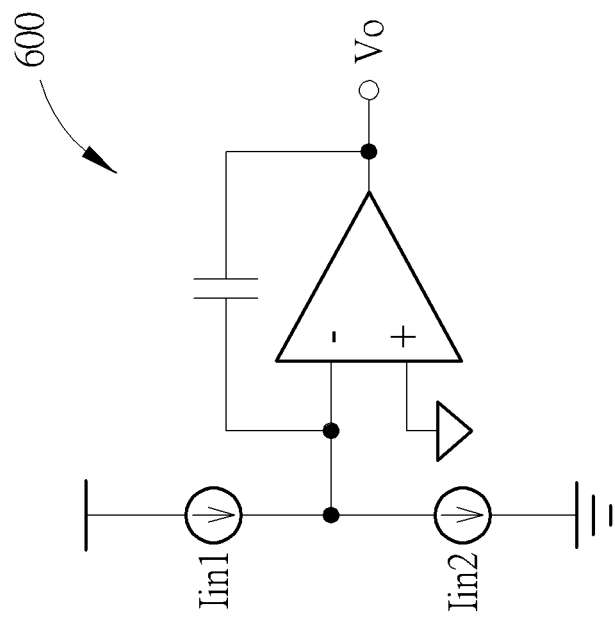
FIG. 6 is a diagram illustrating a third current comparator according to an embodiment of the present invention.
Figure 5:
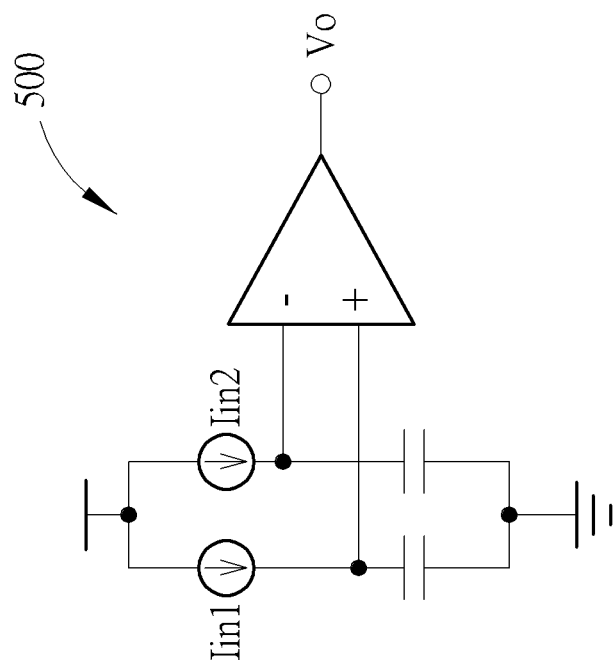
FIG. 5 is a diagram illustrating a second current comparator according to an embodiment of the present invention.

The sorting circuit 114 is arranged to perform a comparison operation upon mismatch error levels of the DAC cells 106_1-106_N to generate the sorting result SR of the DAC cells 106_1-106_N. For example, the sorting circuit 114 may employ a current comparator 400 shown in FIG. 4 for comparing DAC output currents Iin1 and Iin2 of two specific DAC cells among the DAC cells 106_1-106_N to generate a comparison result Vo that can be referenced for sorting mismatch error levels of the two specific DAC cells. For another example, the sorting circuit 114 may employ a current comparator 500 shown in FIG. 5, where the current comparator 500 includes a passive integrator for comparing DAC output currents Iin1 and Iin2 of two specific DAC cells among the DAC cells 106_1-106_N to generate a comparison result Vo that can be referenced for sorting mismatch error levels of the two specific DAC cells. For yet another example, the sorting circuit 114 may employ a current comparator 600 shown in FIG. 6, where the current comparator 600 includes an active integrator for comparing DAC output currents Iin1 and Iin2 of two specific DAC cells among the DAC cells 106_1-106_N to generate a comparison result Vo that can be referenced for sorting mismatch error levels of the two specific DAC cells. To put it simply, the present invention has no limitations on the comparator that is used by the sorting circuit 114.

Figure 7:
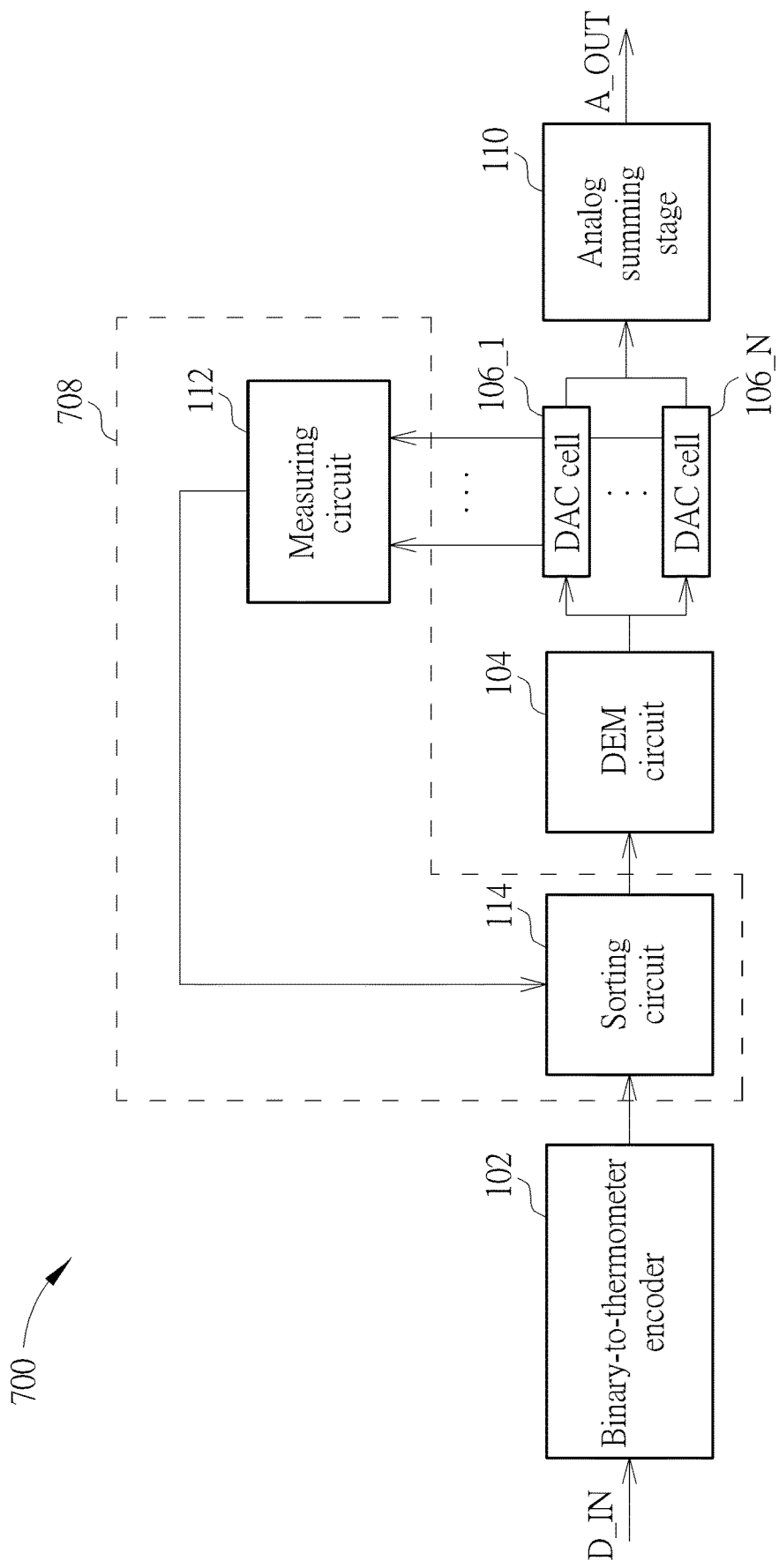
FIG. 7 is a diagram illustrating a second DAC that employs a DEM technique with proposed mismatch error sorting according to an embodiment of the present invention.

The architecture shown in FIG. 1 is for illustrative purposes only, and is not meant to be a limitation of the present invention. In practice, the sorting circuit 114 may be an independent block that is external to the DEM circuit 104 or may be integrated within the DEM circuit 104, depending upon actual design consideration. FIG. 7 is a diagram illustrating a second DAC that employs a DEM technique with proposed mismatch error sorting according to an embodiment of the present invention. The major difference between the DACs 100 and 700 is that the sorting circuit 114 of the mismatch error sorting circuit 708 is an independent block before the DEM circuit 104.

Figure 8:
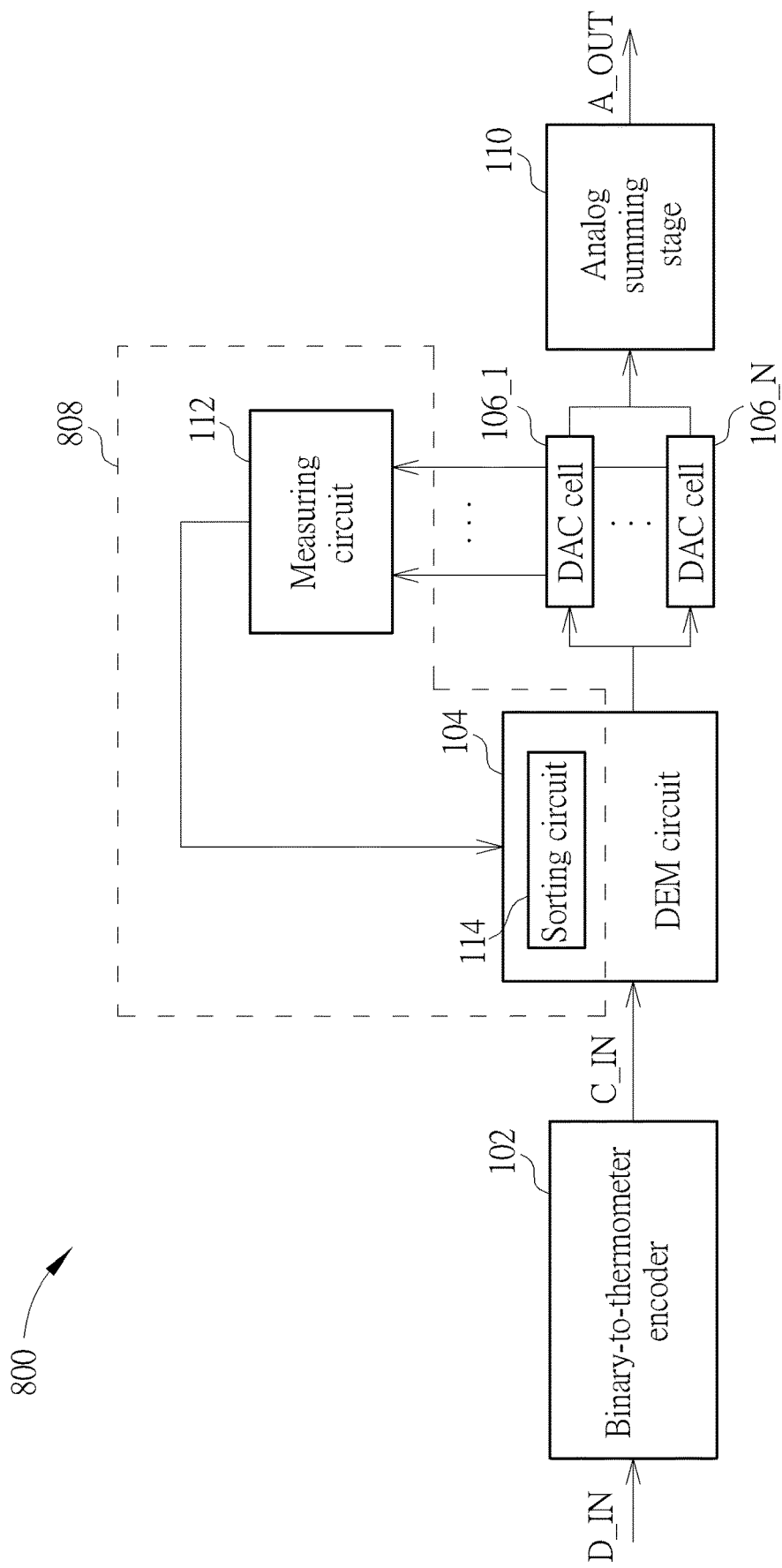
FIG. 8 is a diagram illustrating a third DAC that employs a DEM technique with proposed mismatch error sorting according to an embodiment of the present invention.

FIG. 8 is a diagram illustrating a third DAC that employs a DEM technique with proposed mismatch error sorting according to an embodiment of the present invention. The major difference between the DACs 100 and 800 is that the sorting circuit 114 of the mismatch error sorting circuit 808 is integrated within the DEM circuit 104.

Figure 9:
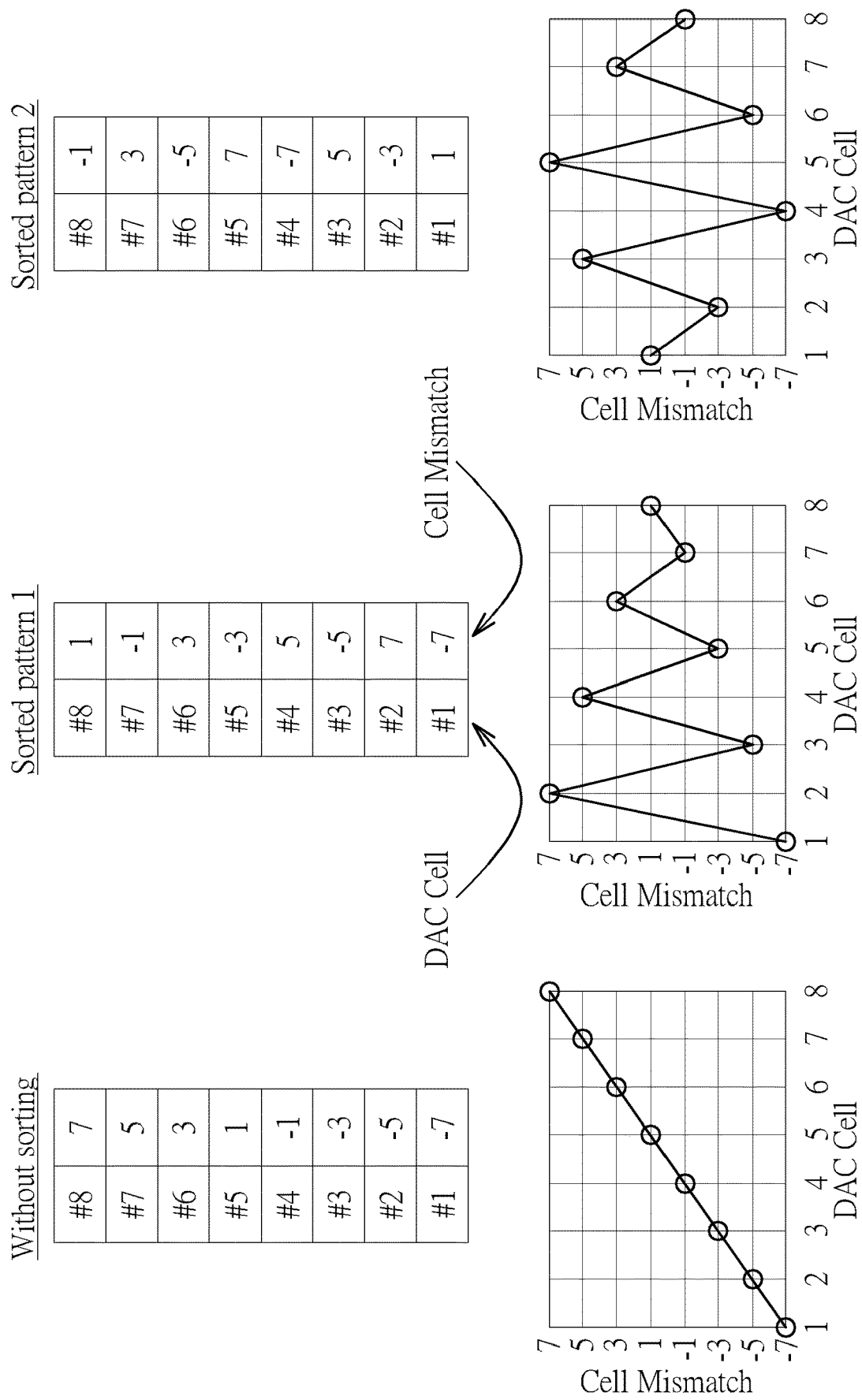
FIG. 9 is a diagram illustrating two patterns of sorted mismatch error levels according to an embodiment of the present invention.

As mentioned above, the sorting circuit 114 performs a comparison operation upon the mismatch error levels of the DAC cells 106_1-106_N to generate the sorting result SR of the DAC cells 106_1-106_N, and the sorting result SR of the DAC cells 106_1-106_N is referenced by the DEM circuit 104 for DAC cell selection. For example, according to the sorting result SR of the DAC cells 106_1-106_N, the mismatch error levels of the DAC cells 106_1-106_N (i.e., sorted mismatch error levels of DAC cells) present a triangle-wave-like pattern. FIG. 9 is a diagram illustrating two patterns of sorted mismatch error levels according to an embodiment of the present invention. For brevity and simplicity, it is assumed that the number of DAC cells 106_1-106_N is equal to 8 (i.e., N=8). In a case where the mismatch error levels of the DAC cells 106_1-106_N are not sorted, the DAC cell 106_1 with a mismatch error level "−7" is treated by the DEM algorithm as a $1^{st}$ DAC cell with an index value "#1", the DAC cell 106_2 with a mismatch error level "#5" is treated by the DEM algorithm as a $2^{nd}$ DAC cell with an index value "#2", the DAC cell 106_3 with a mismatch error level "−3" is treated by the DEM algorithm as a $3^{rd}$ DAC cell with an index value "#3", the DAC cell 106_4 with a mismatch error level "−1" is treated by the DEM algorithm as a $4^{th}$ DAC cell with an index value "#4", the DAC cell 106_5 with a mismatch error level "1" is treated by the DEM algorithm as a $5^{th}$ DAC cell with an index value "#5", the DAC cell 106_6 with a mismatch error level "3" is treated by the DEM algorithm as a $6^{th}$ DAC cell with an index value "#6", the DAC cell 106_7 with a mismatch error level "5" is treated by the DEM algorithm as a $7^{th}$ DAC cell with an index value "10", and the DAC cell 106_8 with a mismatch error level "7" is treated by the DEM algorithm as an $8^{th}$ DAC cell with an index value "#8". Hence, distribution of mismatch error levels of unsorted DAC cells 106_1-106_8 (which act as DAC cells indexed by "#1"-"#8") has a gradient (linear) pattern.

In one exemplary design, the sorting circuit 114 generates the sorting result SR of the DAC cells 106_1-106_N that has a first pattern of sorted mismatch error levels. The DAC cell 106_1 with the mismatch error level "−7" is treated by the DEM algorithm as a $1^{st}$ DAC cell with an index value "#1", the DAC cell 106_8 with the mismatch error level "7" is treated by the DEM algorithm as a $2^{nd}$ DAC cell with an index value "#2", the DAC cell 106_2 with the mismatch error level "−5" is treated by the DEM algorithm as a $3^{rd}$ DAC cell with an index value "#3", the DAC cell 106_7 with the mismatch error level "5" is treated by the DEM algorithm as a $4^{th}$ DAC cell with an index value "#4", the DAC cell 106_3 with the mismatch error level "−3" is treated by the DEM algorithm as a $5^{th}$ DAC cell with an index value "#5", the DAC cell 106_6 with the mismatch error level "3" is treated by the DEM algorithm as a $6^{th}$ DAC cell with an index value "#6", the DAC cell 106_4 with the mismatch error level "−1" is treated by the DEM algorithm as a $7^{th}$ DAC cell with an index value "#7", and the DAC cell 106_5 with the mismatch error level "1" is treated by the DEM algorithm as an $8^{th}$ DAC cell with an index value "#8". Hence, distribution of mismatch error levels of sorted DAC cells 106_1, 106_8, 106_2, 106_7, 103_3, 106_6, 106_4, 106_5 (which act as DAC cells indexed by "#1"-"#8") has a triangle-wave-like pattern.

In another exemplary design, the sorting circuit 114 generates the sorting result SR of the DAC cells 106_1-106_N that has a second pattern of sorted mismatch error levels. The DAC cell 106_5 with the mismatch error level "1" is treated by the DEM algorithm as a $1^{st}$ DAC cell with an index value "#1", the DAC cell 106_3 with the mismatch error level "−3" is treated by the DEM algorithm as a $2^{nd}$ DAC cell with an index value "#2", the DAC cell 106_7 with the mismatch error level "5" is treated by the DEM algorithm as a $3^{rd}$ DAC cell with an index value "#3", the DAC cell 106_1 with the mismatch error level "−7" is treated by the DEM algorithm as a $4^{th}$ DAC cell with an index value "#4", the DAC cell 106_8 with the mismatch error level "7" is treated by the DEM algorithm as a $5^{th}$ DAC cell with an index value "#5", the DAC cell 106_2 with the mismatch error level "−5" is treated by the DEM algorithm as a $6^{th}$ DAC cell with an index value "#6", the DAC cell 106_6 with the mismatch error level "3" is treated by the DEM algorithm as a $7^{th}$ DAC cell with an index value "10", and the DAC cell 106_4 with the mismatch error level "−1" is treated by the DEM algorithm as an $8^{th}$ DAC cell with an index value "#8". Hence, distribution of mismatch error levels of sorted DAC cells 106_5, 106_3, 106_7, 106_1, 103_8, 106_2, 106_6, 106_4 (which act as DAC cells indexed by "#1"-"#8") has a triangle-wave-like pattern.

Figure 10:
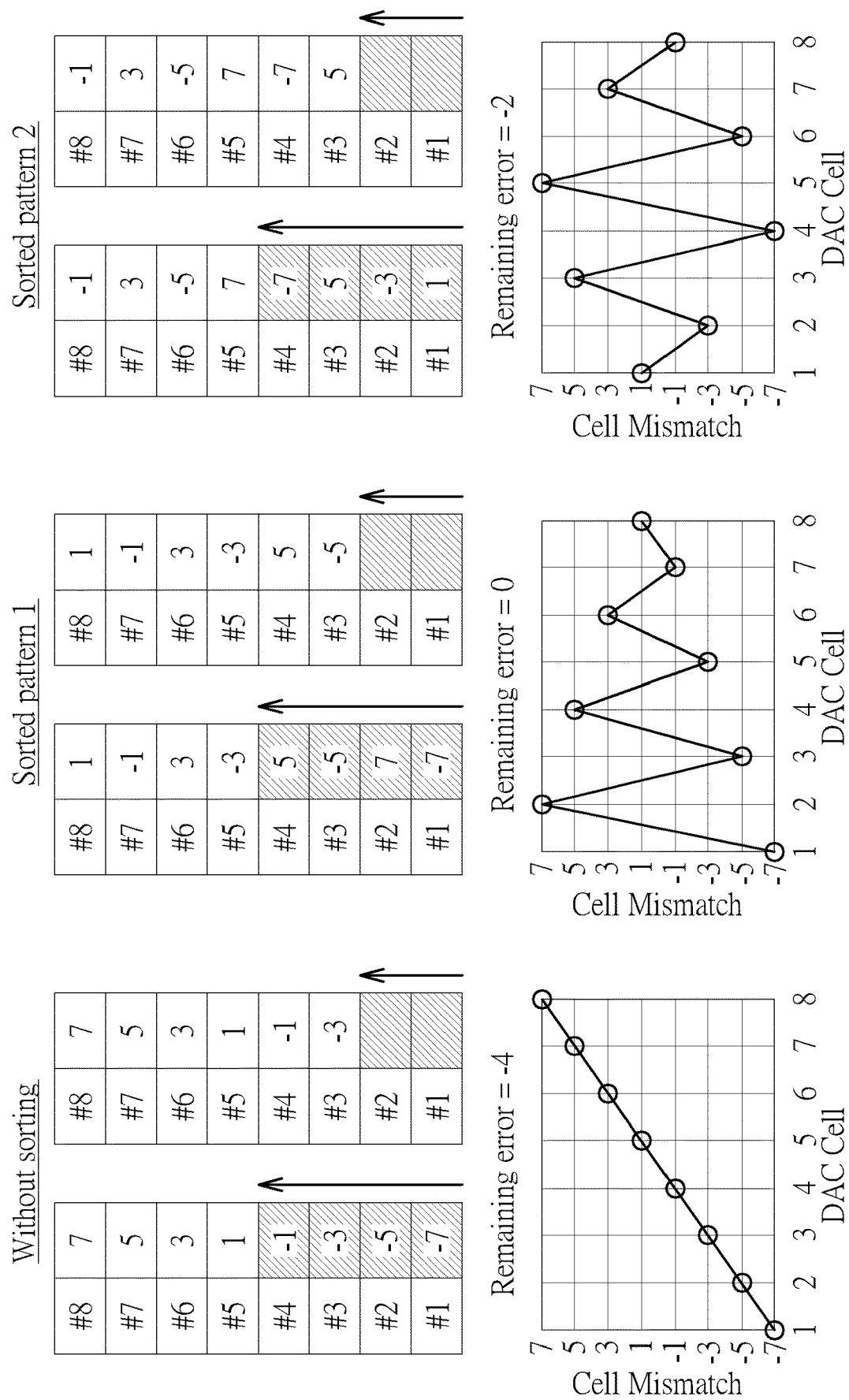
FIG. 10 is a diagram illustrating error cancellation improvement achieved by a first DEM algorithm using the sorting result of DAC cells that has a triangle-wave-like pattern of sorted mismatch error levels.

With sorted mismatch errors of DAC unit cells as an input to the DEM algorithm, mismatch-shaping ability can be improved. FIG. 10 is a diagram illustrating error cancellation improvement achieved by a first DEM algorithm using the sorting result SR of the DAC cells 106_1-106_N that has a triangle-wave-like pattern of sorted mismatch error levels. The first DEM algorithm uses two pointers including a positive pointer and a negative pointer, where the positive pointer indicates the first DAC cell to be used for each positive data, the negative pointer indicates the first DAC cell to be used for each negative data, and the two pointers advance in the same direction and wrap around. Suppose that a data sequence [+4 −2] is input to the DAC 100/700/800. In a case where the mismatch error levels of the DAC cells 106_1-106_N are not sorted, the first DEM algorithm selects four DAC cells indexed by "#1"-"#4" for data=+4, and then selects two DAC cells indexed by "#1" and "#2" for data=−2. Hence, mismatch errors of DAC cells indexed by "#1" and "#2" are cancelled, and the remaining error caused by DAC cells indexed by "#3" and "#4" is equal to −4 (i.e., −4=(−1)+(−3)).

In a case where the sorting circuit 114 generates the sorting result SR of the DAC cells 106_1-106_N that has the first pattern of sorted mismatch error levels, the first DEM algorithm selects four DAC cells indexed by "#1"-"#4" for data=+4, and then selects two DAC cells indexed by "#1" and "#2" for data=−2. Hence, mismatch errors of DAC cells indexed by "#1" and "#2" are cancelled, and the remaining error caused by DAC cells indexed by "#3" and "#4" is equal to 0 (i.e., 0=(−5)+(+5)).

In a case where the sorting circuit 114 generates the sorting result SR of the DAC cells 106_1-106_N that has the second pattern of sorted mismatch error levels, the first DEM algorithm selects four DAC cells indexed by "#1"-"#4" for data=+4, and then selects two DAC cells indexed by "#1" and "#2" for data=−2. Hence, mismatch errors of DAC cells indexed by "#1" and "#2" are cancelled, and the remaining error caused by DAC cells indexed by "#3" and "#4" is equal to −2 (i.e., −2=(−7)+(+5)).

Figure 11:
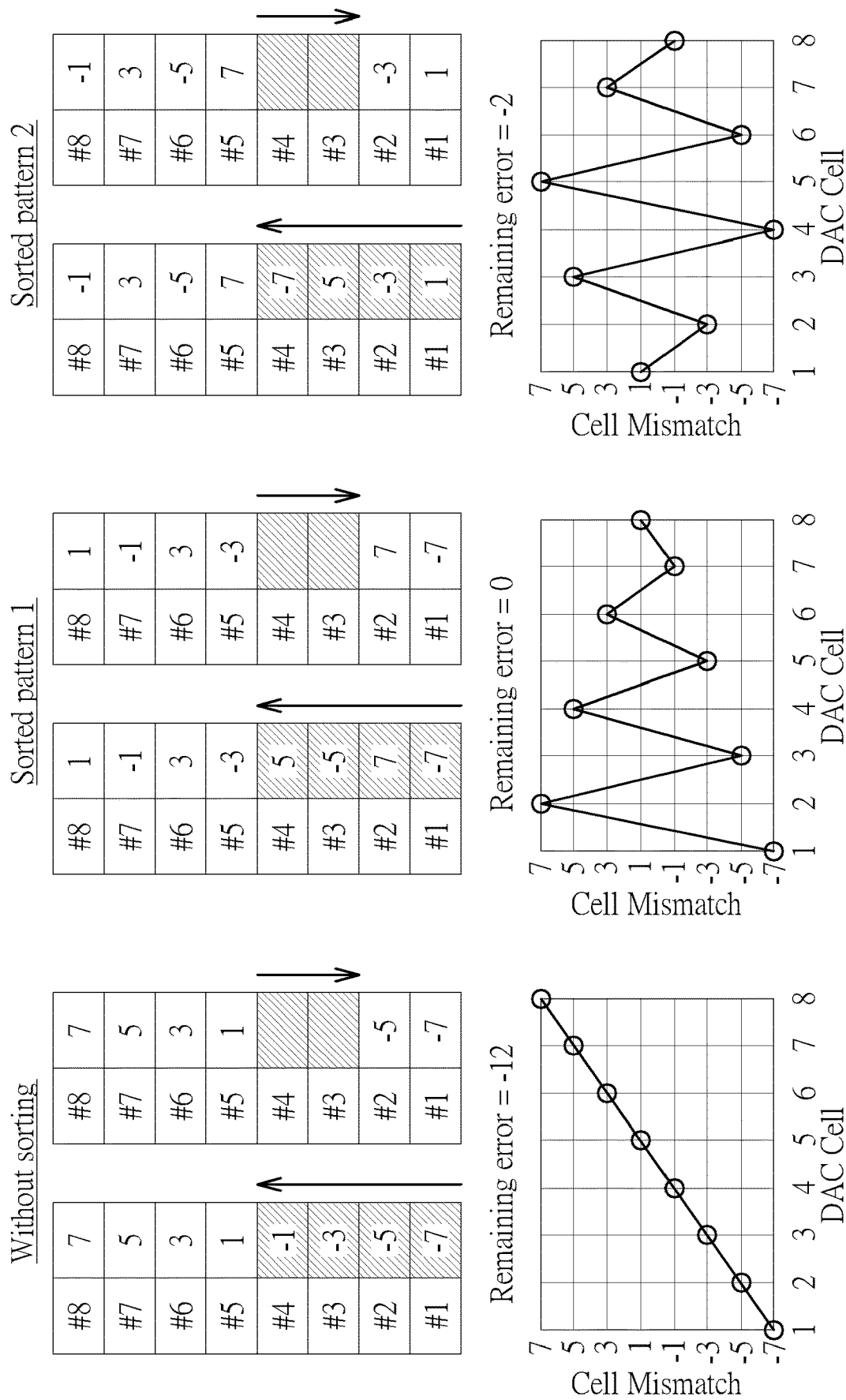
FIG. 11 is a diagram illustrating error cancellation improvement achieved by a second DEM algorithm using the sorting result of DAC cells that has a triangle-wave-like pattern of sorted mismatch error levels.

FIG. 11 is a diagram illustrating error cancellation improvement achieved by a second DEM algorithm using the sorting result SR of the DAC cells 106_1-106_N that has a triangle-wave-like pattern of sorted mismatch error levels. The second DEM algorithm uses two pointers including a pointer "start" and a pointer "current", where the pointer "start" defines the location of the starting DAC cell for DEM operation, and the pointer "current" defines the first cell to be used for positive data. For negative data, the (current −1) cell is used as the first cell. The pointer "current" advances in a direction and wraps around for positive data, and advances in an opposite direction and wraps around for negative data. Suppose that a data sequence [+4 −2] is input to the DAC 100/700/800. In a case where the mismatch error levels of the DAC cells 106_1-106_N are not sorted, the second DEM algorithm selects four DAC cells indexed by "#1"-"#4" for data=+4, and then selects two DAC cells indexed by "#4" and "#3" for data=−2. Hence, mismatch errors of DAC cells indexed by "#4" and "#3" are cancelled, and the remaining error caused by DAC cells indexed by "#2" and "#1" is equal to −12 (i.e., −12=(−5)+(−7)).

In a case where the sorting circuit 114 generates the sorting result SR of the DAC cells 106_1-106_N that has the first pattern of sorted mismatch error levels, the second DEM algorithm selects four DAC cells indexed by "#1"-"#4" for data=+4, and then selects two DAC cells indexed by "#4" and "#3" for data=−2. Hence, mismatch errors of DAC cells indexed by "#4" and "#3" are cancelled, and the remaining error caused by DAC cells indexed by "#2" and "#1" is equal to 0 (i.e., 0=(7)+(−7)).

In a case where the sorting circuit 114 generates the sorting result SR of the DAC cells 106_1-106_N that has the second pattern of sorted mismatch error levels, the second DEM algorithm selects four DAC cells indexed by "#1"-"#4" for data=+4, and then selects two DAC cells indexed by "#4" and "#3" for data=−2. Hence, mismatch errors of DAC cells indexed by "#4" and "#3" are cancelled, and the remaining error caused by DAC cells indexed by "#2" and "#1" is equal to −2 (i.e., −2=(−3)+(+1)).

As can be seen from FIG. 10 and FIG. 11, the DEM circuit 104 can have improved mismatch-shaping ability by performing DAC cell selection according to the sorting result SR of DAC cells 106_1-106_N that has a triangle-wave-like pattern of sorted mismatch error levels.

Figure 12:
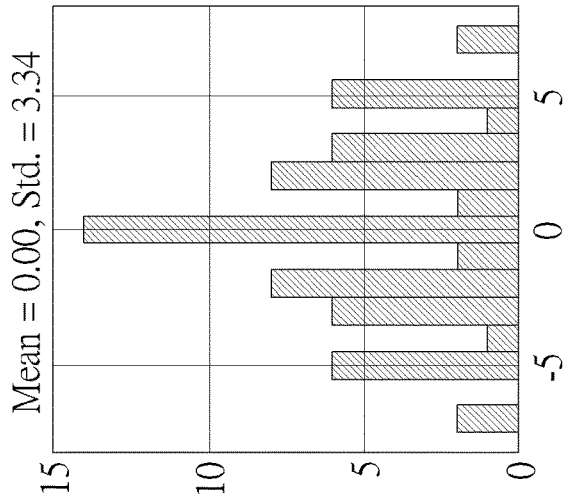
FIG. 12 is a diagram illustrating error cancellation improvement achieved by the first DEM algorithm using the sorting result of DAC cells under different data sequences [+D1−D2].
Figure 12:
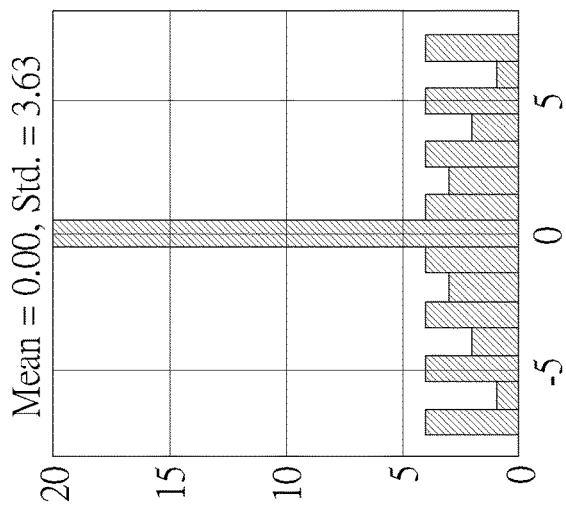
Figure 12:
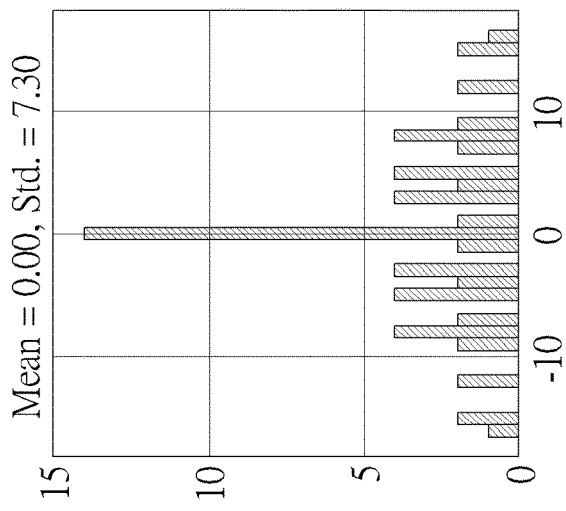

FIG. 12 is a diagram illustrating error cancellation improvement achieved by the first DEM algorithm using the sorting result SR of the DAC cells 106_1-106_N under different data sequences [+D1−D2], where D1 and D2 are swept from 1 to 8. The top half of FIG. 12 shows remaining errors that are not cancelled after the first DEM algorithm operates according to different data sequences [+D1−D2]. The bottom half of FIG. 12 shows histogram plots of the remaining errors. In a case where the mismatch error levels of the DAC cells 106_1-106_N are not sorted, a mean value of remaining errors is equal to 0.00, and a standard deviation (Std.) value of remaining errors is equal to 7.30. In a case where the sorting circuit 114 generates the sorting result SR of the DAC cells 106_1-106_N that has the first pattern of sorted mismatch error levels, a mean value of remaining errors is equal to 0.00, and a standard deviation (Std.) value of remaining errors is equal to 3.63. In a case where the sorting circuit 114 generates the sorting result SR of the DAC cells 106_1-106_N that has the second pattern of sorted mismatch error levels, a mean value of remaining errors is equal to 0.00, and a standard deviation (Std.) value of remaining errors is equal to 3.34.

Figure 13:
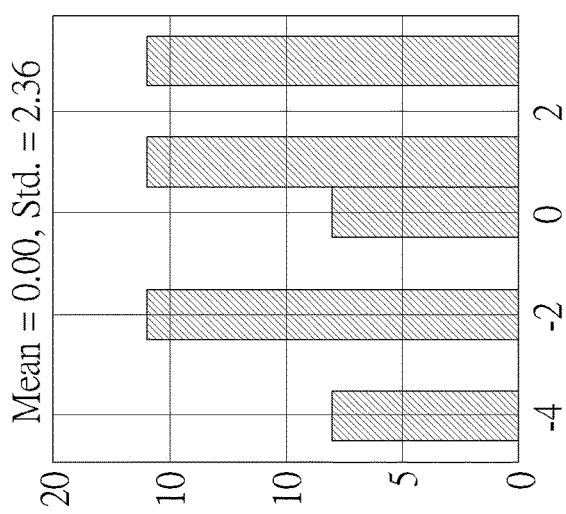
FIG. 13 is a diagram illustrating error cancellation improvement achieved by the second DEM algorithm using the sorting result of DAC cells under different data sequences [+D1−D2].
Figure 13:
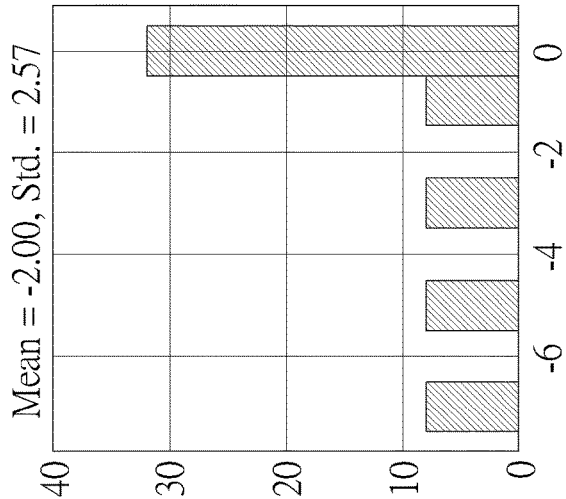
Figure 13:
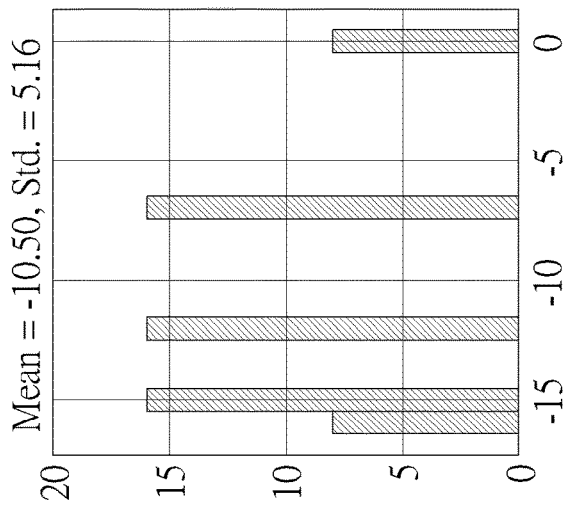

FIG. 13 is a diagram illustrating error cancellation improvement achieved by the second DEM algorithm using the sorting result SR of the DAC cells 106_1-106_N under different data sequences [+D1 −D2], where D1 and D2 are swept from 1 to 8. The top half of FIG. 13 shows remaining errors that are not cancelled after the second DEM algorithm operates according to different data sequences [+D1 −D2]. The bottom half of FIG. 13 shows histogram plots of the remaining errors. In a case where the mismatch error levels of the DAC cells 106_1-106_N are not sorted, a mean value of remaining errors is equal to −10.50, and a standard deviation (Std.) value of remaining errors is equal to 5.16. In a case where the sorting circuit 114 generates the sorting result SR of the DAC cells 106_1-106_N that has the first pattern of sorted mismatch error levels, a mean value of remaining errors is equal to −2.0, and a standard deviation (Std.) value of remaining errors is equal to 2.57. In a case where the sorting circuit 114 generates the sorting result SR of the DAC cells 106_1-106_N that has the second pattern of sorted mismatch error levels, a mean value of remaining errors is equal to 0.00, and a standard deviation (Std.) value of remaining errors is equal to 2.36.

In conclusion, for both DEM algorithms, standard deviation values with sorted patterns are smaller than that without sorting. For the second DEM algorithm, mean values with sorted patterns are closer to zero compared to that without sorting. Furthermore, error cancellation performance of DEM with the use of the second sorted pattern is better than that of DEM with the use of the first sorted pattern due to a smaller gap between mismatch error levels of the first DAC cell indexed by "#1" and the last DAC cell indexed by "#8".

The aforementioned first DEM algorithm uses two pointers including a positive pointer and a negative pointer, where the positive pointer indicates the first DAC cell to be used for each positive data, the negative pointer indicates the first DAC cell to be used for each negative data, and the two pointers advance in the same direction and wrap around. When the two pointers are pointing to the same location, it is required to update both of the two pointers to a new location.

The aforementioned second DEM algorithm uses two pointers including a pointer "start" and a pointer "current", where the pointer "start" defines the location of the starting DAC cell for DEM operation, and the pointer "current" defines the first cell to be used for positive data. For negative data, the (current −1) cell is used as the first cell. The pointer "current" advances in a direction and wraps around for positive data, and advances in an opposite direction and wraps around for negative data. When the two pointers are pointing to the same location, it is required to update both of the two pointers to a new location.

Figure 14:
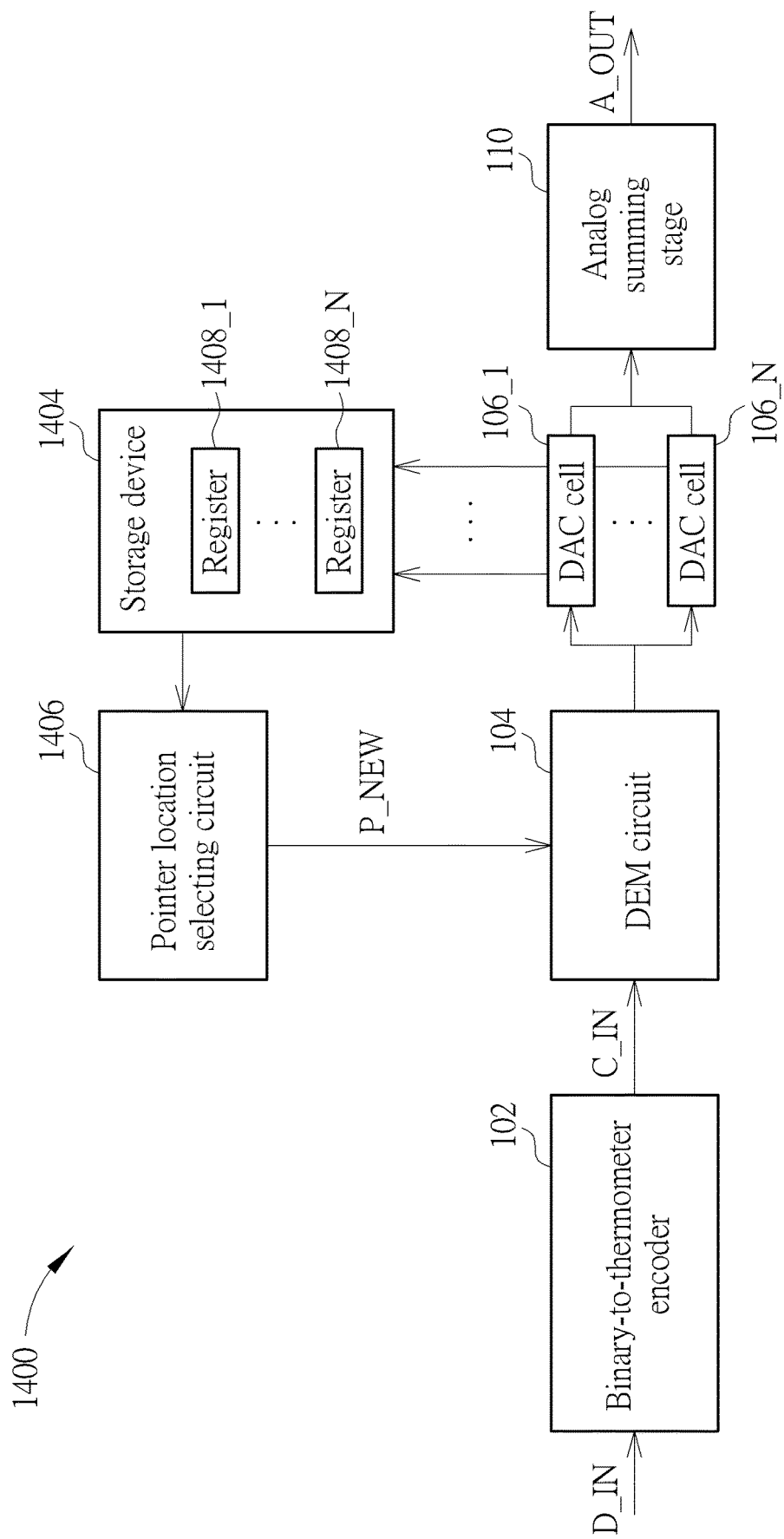
FIG. 14 is a diagram illustrating a DAC that employs a DEM technique with proposed new pointer selection according to an embodiment of the present invention.

The present invention further proposes referring to utilization rates of DAC cells to determine a new pointer location when multiple pointers used by a DEM algorithm are pointing to the same location. FIG. 14 is a diagram illustrating a DAC that employs a DEM technique with proposed new pointer selection according to an embodiment of the present invention. The DAC 1400 includes a storage device 1404, a pointer location selecting circuit 1406, and the aforementioned binary-to-thermometer encoder 102, DEM circuit 104, DAC cells 106_1-106_N (N≥2), and analog summing stage 110. The storage device 1404 is arranged to record utilization rates of the DAC cells 106_1-106_N. For example, the storage device 1404 may include a plurality of registers 1408_1-1408_N (N≥2), each arranged to record the utilization rate of a corresponding DAC cell. In this embodiment, the utilization rate of a DAC cell may be recorded by keeping track of the number of times the DAC cell has been selected by the DEM circuit 104. However, this is for illustrative purposes only, and is not meant to be a limitation of the present invention. In practice, any parameter that is indicative of the utilization rate of one DAC cell may be recorded in one register in the storage device 1404.

The pointer location selecting circuit 1406 is arranged to select a new pointer location P_NEW according to recorded utilization rates of DAC cells 106_1-106_N and the input code (which is a signed thermometer code) C_IN of DEM circuit 104. In this embodiment, the pointer location selecting circuit 1406 employs a least-used first algorithm for new pointer location selection.

Figure 15:
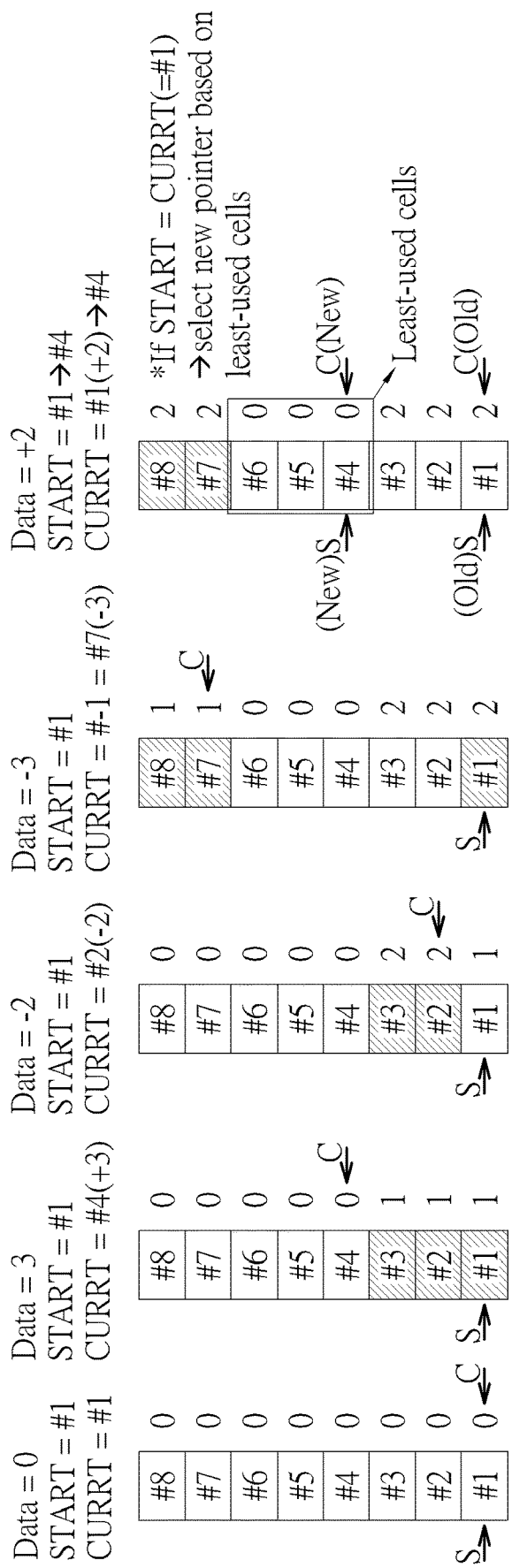
FIG. 15 is a diagram illustrating a first part of a DEM operation with proposed new pointer selection according to an embodiment of the present invention.
Figure 16:
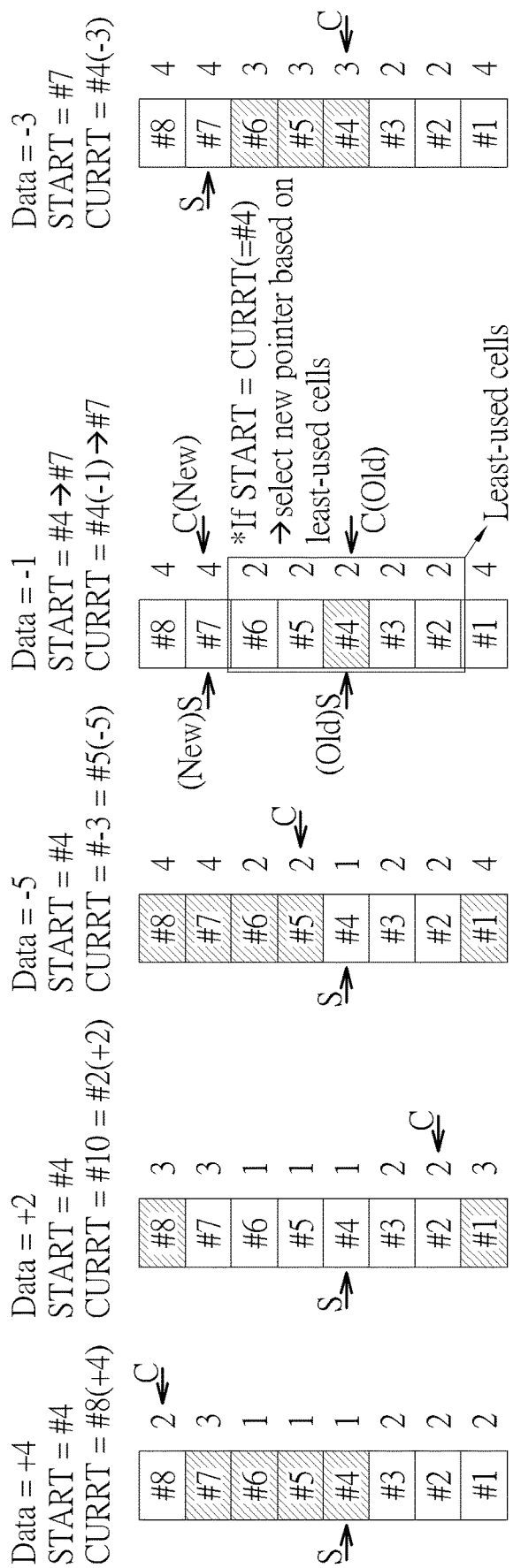
FIG. 16 is a diagram illustrating a second part of the DEM operation with proposed new pointer selection according to an embodiment of the present invention.

Please refer to FIG. 15 and FIG. 16. FIG. 15 and FIG. 16 are diagrams illustrating a DEM operation with proposed new pointer selection according to an embodiment of the present invention. For brevity and simplicity, it is assumed that the second DEM algorithm with the use of two pointers, including a pointer "START" labeled by S and a pointer "CURRT" labeled by C, is employed by the DEM circuit 104, and a data sequence [0+3 −2 −3+2 +4+2 −5 −1 −3] is received by the DAC 1400. Initially, both of the pointers S and C point to the same location such as the DAC cell index "#1", and each of cell usage numbers recorded for DAC cell indexes "#1"-"#8" is set by the same initial value 0. At a next cycle, the positive data +3 would advance the pointer C in an increment direction by 3, such that the updated pointer C points to the DAC cell index "#4", and each of cell usage numbers recorded for DAC cell indexes "#1"-"#3" is incremented by 1. At a next cycle, the negative data −2 would advance the pointer C in a decrement direction by 2, such that the updated pointer C points to the DAC cell indexed by #2, and each of cell usage numbers recorded for DAC cell indexes "#2" and "#3" is incremented by 1. At a next cycle, the negative data −3 would advance the pointer C in a decrement direction by 3, such that updated pointer C wraps around and points to the DAC cell indexed by #7, and each of cell usage numbers recorded for DAC cell indexes "#1", "#8", "#7" is incremented by 1. At a next cycle, the positive data +2 would advance the pointer C in an increment direction by 2, such that the updated pointer C wraps around and points to the DAC cell indexed by #1, and each of cell usage numbers recorded for DAC cell indexes "#8" and "#7" is incremented by 1. At this moment, two pointers S and C are pointing to the same location (i.e., DAC cell index #1). Hence, the pointer location selecting circuit 1406 is triggered to select a new pointer location P_NEW that is different from the current location (i.e., DAC cell index #1). Since the least-used first algorithm is employed by the pointer location selecting circuit 1406, the cell usage numbers recorded for DAC cells with DAC cell indexes "#1"-"#8" are checked to find least-used DAC cells. As shown in FIG. 15, DAC cells with DAC cell indexes "#4"-"#6" are least-used DAC cells among DAC cells 106_1-106_N (N=8). In addition, the sign of a next data (particularly, the sign of an input code generated from binary-to-thermometer encoding of the next data) is checked to determine which one of the least-used DAC cells should be the first DAC cell used by the next data. Since the next data is a positive data +4, the pointer location selecting circuit 1406 sets the new pointer location P_NEW by #4, such that the DAC cell with the DAC cell index "#4" will be the first DAC cell to be used by the next data +4 in the increment direction. As shown in FIG. 15, both of the pointers S and C are moved to point to the new pointer location P_NEW that is set by the DAC cell index "#4" according to the proposed least-used first algorithm.

At a next cycle, the positive data +4 would advance the pointer C in an increment direction by 4, such that the updated pointer C points to the DAC cell index "#8", and each of cell usage numbers recorded for DAC cell indexes "#4"-"#7" is incremented by 1. At a next cycle, the positive data +2 would advance the pointer C in an increment direction by 2, such that the updated pointer C wraps around and points to the DAC cell indexed by #2, and each of cell usage numbers recorded for DAC cell indexes "#8" and "#1" is incremented by 1. At a next cycle, the negative data −5 would advance the pointer C in a decrement direction by 5, such that updated pointer C wraps around and points to the DAC cell indexed by #5, and each of cell usage numbers recorded for DAC cell indexes "#1", "#8", "#7", "#6", "#5" is incremented by 1. At a next cycle, the negative data −1 would advance the pointer C in a decrement direction by 1, such that the updated pointer C points to the DAC cell indexed by #4, and the cell usage number recorded for DAC cell index "#4" is incremented by 1. At this moment, two pointers S and C are pointing to the same location (i.e., DAC cell index #4). Hence, the pointer location selecting circuit 1406 is triggered to select a new pointer location P_NEW that is different from the current location (i.e., DAC cell index #4). Since the least-used first algorithm is employed by the pointer location selecting circuit 1406, the cell usage numbers recorded for DAC cells with DAC cell indexes "#1"-"#8" are checked to find least-used DAC cells. As shown in FIG. 16, DAC cells with DAC cell indexes "#2"-"#6" are least-used DAC cells among DAC cells 106_1-106_N (N=8). In addition, the sign of a next data (particularly, the sign of an input code generated from binary-to-thermometer encoding of the next data) is checked to determine which one of the least-used DAC cells should be the first DAC cell used by the next data. Since the next data is a negative data −3, the pointer location selecting circuit 1406 sets the new pointer location P_NEW by #7, such that the DAC cell with the DAC cell index "#6" is the first DAC cell to be used by the next data −3 in the decrement direction. As shown in FIG. 16, both of the pointers S and C are moved to point to the new pointer location P_NEW that is set by the DAC cell index "#7" according to the proposed least-used first algorithm. At a next cycle, the negative data −3 would advance the pointer C in a decrement direction by 3, such that the updated pointer C points to the DAC cell index "#3", and each of cell usage numbers recorded for DAC cell indexes "#4"-"#6" is incremented by 1.

The new pointer location selected based on the proposed least-used first algorithm has better error cancellation performance compared to the conventional design that changes a current pointer location to a new pointer location based on a random, shift, or fixed value. For example, a DEM operation with the new pointer location selected based on the proposed least-used first algorithm has lower harmonic distortion (i.e., higher SNDR) and lower spurious signal (i.e., higher SFDR) than a DEM operation with the new pointer location selected based on a fixed value. For another example, a DEM operation with the new pointer location selected based on the proposed least-used first algorithm has lower noise floor (i.e., higher SNR) than a DEM operation with the new pointer location selected based on a random value.

The proposed DAC 100/700/800/1400 is applicable to a variety of applications. For example, the proposed DAC 100/700/800/1400 can be used in a decoder for low total harmonic distortion (THD) analog output. For another example, the proposed DAC 100/700/800/1400 can be used in one of segmented DACs in a decoder circuit for low THD output. For yet another example, the proposed DAC 100/700/800/1400 can be used in a sigma-delta modulator ADC circuit. It should be noted that these applications are for illustrative purposes only, and are not meant to be limitations of the present invention. In practice, any application using a DAC with any of the proposed techniques (e.g., DEM with mismatch error sorting and DEM with least-used first algorithm) falls within the scope of the present invention.

It should be noted that a DEM technique that performs DAC cell selection according to sorted DAC cells may be Data Weighted Averaging (DWA), $1^{st}$-order DEM, $2^{nd}$-order DEM, scrambler, or any suitable DEM algorithm. In addition, a DEM technique with two or more pointers using least-used first algorithm may be $1^{st}$-order DEM, $2^{nd}$-order DEM, or any suitable DEM algorithm. To put it simply, the present invention has no limitations on the DEM algorithm employed by the DEM circuit 104. Any DAC design using DEM with mismatch error sorting and/or DEM with least-used first algorithm falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter (DAC) comprising:
a plurality of DAC cells;
a mismatch error sorting circuit, arranged to generate a sorting result of the plurality of DAC cells according to mismatch error levels of the plurality of DAC cells; and
a dynamic element matching (DEM) circuit, arranged to shape the mismatch error levels of the plurality of DAC cells according to the sorting result of the plurality of DAC cells.

2. The DAC of claim 1, wherein according to the sorting result of the plurality of DAC cells, the mismatch error levels of the plurality of DAC cells present a triangle-wave-like pattern.

3. The DAC of claim 2, wherein according to the sorting result of the plurality of DAC cells, a DAC cell with a largest positive mismatch error level is sorted adjacent to a DAC cell with a smallest negative mismatch error.

4. The DAC of claim 1, wherein the mismatch error sorting circuit comprises:
a measuring circuit, arranged to acquire the mismatch error levels of the plurality of DAC cells by measuring current outputs of the plurality of DAC cells; and
a sorting circuit, arranged to perform a comparison operation upon the mismatch error levels of the plurality of DAC cells to generate the sorting result of the plurality of DAC cells.

5. The DAC of claim 4, wherein the sorting circuit is external to the DEM circuit.

6. The DAC of claim 4, wherein the sorting circuit is integrated within the DEM circuit.

7. The DAC of claim 1, wherein the mismatch error sorting circuit comprises:
a measuring circuit, arranged to acquire the mismatch error levels of the plurality of DAC cells by measuring voltage outputs of the plurality of DAC cells; and
a sorting circuit, arranged to perform a comparison operation upon the mismatch error levels of the plurality of DAC cells to generate the sorting result of the plurality of DAC cells.

8. The DAC of claim 7, wherein the sorting circuit is external to the DEM circuit.

9. The DAC of claim 7, wherein the sorting circuit is integrated within the DEM circuit.

10. The DAC of claim 1, wherein the plurality of DAC cells are bi-level DAC cells or tri-level DAC cells.

11. A digital-to-analog converter (DAC) comprising:
a plurality of DAC cells;
a storage device, arranged to record utilization rates of the plurality of DAC cells;
a pointer location selecting circuit, arranged to select a new pointer location according to the utilization rates of the plurality of DAC cells and an input code; and
a dynamic element matching (DEM) circuit, arranged to shape mismatch error levels of the plurality of DAC cells according to the new pointer location selected by the pointer location selecting circuit and the input code received by the DEM circuit.

12. The DAC of claim 11, wherein the pointer location selecting circuit is arranged to refer to the utilization rates of the plurality of DAC cells to find at least one least-used DAC cell among the plurality of DAC cells, and determine the new pointer location according to the at least one least-used DAC cell and the input code.

13. A digital-to-analog conversion method comprising:
generating a sorting result of a plurality of DAC cells according to mismatch error levels of the plurality of DAC cells; and
performing a dynamic element matching (DEM) operation to shape the mismatch error levels of the plurality of DAC cells according to the sorting result of the plurality of DAC cells.

14. The digital-to-analog conversion method of claim 13, wherein according to the sorting result of the plurality of DAC cells, the mismatch error levels of the plurality of DAC cells present a triangle-wave-like pattern.

15. The digital-to-analog conversion method of claim 14, wherein according to the sorting result of the plurality of DAC cells, a DAC cell with a largest positive mismatch error level is sorted adjacent to a DAC cell with a smallest negative mismatch error.

16. The digital-to-analog conversion method of claim 13, wherein generating the sorting result of the plurality of DAC cells according to the mismatch error levels of the plurality of DAC cells comprises:
acquiring the mismatch error levels of the plurality of DAC cells by measuring current outputs of the plurality of DAC cells; and
performing a comparison operation upon the mismatch error levels of the plurality of DAC cells to generate the sorting result of the plurality of DAC cells.

17. The digital-to-analog conversion method of claim 16, wherein performing the comparison operation upon the mismatch error levels of the plurality of DAC cells to generate the sorting result of the plurality of DAC cells is external to the DEM operation or integrated within the DEM operation.

18. The digital-to-analog conversion method of claim 13, wherein generating the sorting result of the plurality of DAC cells according to the mismatch error levels of the plurality of DAC cells comprises:
   acquiring the mismatch error levels of the plurality of DAC cells by measuring voltage outputs of the plurality of DAC cells; and
   performing a comparison operation upon the mismatch error levels of the plurality of DAC cells to generate the sorting result of the plurality of DAC cells.

19. The digital-to-analog conversion method of claim 18, wherein performing the comparison operation upon the mismatch error levels of the plurality of DAC cells to generate the sorting result of the plurality of DAC cells is external to the DEM operation or integrated within the DEM operation.

20. The digital-to-analog conversion method of claim 13, wherein the plurality of DAC cells are bi-level DAC cells or tri-level DAC cells.

* * * * *